United States Patent
Shim et al.

(10) Patent No.: US 7,739,582 B2
(45) Date of Patent: *Jun. 15, 2010

(54) ERROR CORRECTION METHOD FOR HIGH DENSITY DISC

(75) Inventors: Jae-seong Shim, Seoul (KR); Myoung-june Kim, Suwon (KR); In-sik Park, Suwon (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 1026 days.

This patent is subject to a terminal disclaimer.

(21) Appl. No.: 11/429,340

(22) Filed: May 8, 2006

(65) Prior Publication Data

US 2006/0242548 A1    Oct. 26, 2006

Related U.S. Application Data (63) Continuation of application No. 10/890,225, filed on Jul. 14, 2004, now Pat. No. 7,370,267, which is a continuation of application No. 09/612,971, filed on Jul. 10, 2000, now Pat. No. 6,931,586.

(30) Foreign Application Priority Data

Jul. 8, 1999 (KR) .................................. 99-27453

(51) Int. Cl.
  G06F 11/00 (2006.01)
  H03M 13/00 (2006.01)
(52) U.S. Cl. ........................................ 714/800; 714/755
(58) Field of Classification Search ........................ None
  See application file for complete search history.

(56) References Cited

U.S. PATENT DOCUMENTS 4,719,628 A    1/1988  Ozaki et al.

(Continued)

FOREIGN PATENT DOCUMENTS

EP    0481752    4/1992

(Continued)

OTHER PUBLICATIONS

"120 mm DVD Rewritable Disk (DVD-RAM)", ECMA Standardizing Information and Communication Systems, Standard ECMA-272, $2^{nd}$ Edition, Jun. 1999, pp. 1-99.

(Continued)

*Primary Examiner*—Christine T Tu
(74) *Attorney, Agent, or Firm*—NSIP Law (57) ABSTRACT

An error correction method for optical discs, and more particularly, an error correction method appropriate to high density discs is provided. The error correction method adds inner parity and outer parity to an error correction block of size n byte x m x o. The method comprises the steps of obtaining a plurality of inner parity blocks (PI blocks) by segmenting the error correction block in the inner parity (PI) direction into x segments; generating e-byte PI for each of the plurality of PI blocks generated by segmenting, and adding the e-bytes to the PI blocks PIs to the PI direction; and generating f-byte outer parity (PO) in the PO direction of the error correction block, and adding the POs to the PO direction. The error correction method enhances error correction capability while maintaining a redundancy of parity signal on a level similar to conventional DVDs.

4 Claims, 12 Drawing Sheets

U.S. PATENT DOCUMENTS

| | | |
|---|---|---|
| 5,517,484 A | 5/1996 | Takagi et al. |
| 5,559,506 A * | 9/1996 | Leitch ..................... 340/7.43 |
| 5,586,108 A | 12/1996 | Hoshino |
| 5,796,755 A | 8/1998 | Shon |
| 6,079,043 A | 6/2000 | Yoshiura et al. |
| 6,252,838 B1 | 6/2001 | Kuroda et al. |
| 6,363,511 B1 * | 3/2002 | Massoudi .................... 714/755 |
| 6,931,586 B1 | 8/2005 | Shim et al. |
| 7,370,267 B2 * | 5/2008 | Shim et al. ................. 714/800 |
| 7,383,491 B2 * | 6/2008 | Shim et al. ................. 714/800 |
| 7,401,285 B2 * | 7/2008 | Shim et al. ................. 714/800 |

FOREIGN PATENT DOCUMENTS

| | | |
|---|---|---|
| EP | 1067695 | 1/2001 |
| JP | 7-192402 | 7/1995 |
| JP | 8-7500 | 12/1996 |
| JP | 10-188489 | 7/1998 |
| JP | 10-334607 | 12/1998 |
| JP | 2000-323995 | 11/2000 |
| KR | 1998-87532 | 12/1998 |

OTHER PUBLICATIONS

Linder, Hilmar, et al., "A Forward Error Correction Based Multicast Transport Protocol For Multimedia Applications in Satellite Environments", 1997 IEEE, pp. 419-425.

* cited by examiner

PRIOR ART

FIG. 1

| | 172 BYTES | | | | PI (10 BYTES) | | |
|---|---|---|---|---|---|---|---|
| $B_{0,0}$ | $B_{0,1}$ | ... | $B_{0,170}$ | $B_{0,171}$ | $B_{0,172}$ | ... | $B_{0,181}$ |
| $B_{1,0}$ | $B_{1,1}$ | ... | $B_{1,170}$ | $B_{1,171}$ | $B_{1,172}$ | ... | $B_{1,181}$ |
| $B_{2,0}$ | $B_{2,1}$ | ... | $B_{2,170}$ | $B_{2,171}$ | $B_{2,172}$ | ... | $B_{2,181}$ |
| ⋮ | ⋮ | ⋮ | ⋮ | ⋮ | ⋮ | ⋮ | ⋮ |
| $B_{189,0}$ | $B_{189,1}$ | ... | $B_{189,170}$ | $B_{189,171}$ | $B_{189,172}$ | ... | $B_{189,181}$ |
| $B_{190,0}$ | $B_{190,1}$ | ... | $B_{190,170}$ | $B_{190,171}$ | $B_{190,172}$ | ... | $B_{190,181}$ |
| $B_{191,0}$ | $B_{191,1}$ | ... | $B_{191,170}$ | $B_{191,171}$ | $B_{191,172}$ | ... | $B_{191,181}$ |
| $B_{192,0}$ | $B_{192,1}$ | ... | $B_{192,170}$ | $B_{192,170}$ | $B_{192,172}$ | ... | $B_{192,181}$ |
| ... | ... | ... | ... | ... | ... | ... | ... |
| $B_{207,0}$ | $B_{207,1}$ | ... | $B_{207,170}$ | $B_{207,171}$ | $B_{207,172}$ | ... | $B_{207,181}$ |

(192 BYTES vertical; PO (16 BYTES) at bottom)

PRIOR ART

| | 1ST PI 8B | | 2ND PI 8B | | 3RD PI 8B | | 4TH PI 8B | | |
|---|---|---|---|---|---|---|---|---|---|
| $B_{0,688}$ | $B_{0,695}$ | $B_{0,696}$ | $B_{0,703}$ | $B_{0,704}$ | $B_{0,711}$ | $B_{0,712}$ | $B_{0,719}$ | | |
| $B_{1,688}$ | $B_{1,695}$ | $B_{1,696}$ | $B_{1,703}$ | $B_{1,704}$ | $B_{1,711}$ | $B_{1,712}$ | $B_{1,719}$ | | |
| $B_{2,688}$ | $B_{2,695}$ | $B_{2,696}$ | $B_{2,703}$ | $B_{2,704}$ | $B_{2,711}$ | $B_{2,712}$ | $B_{2,719}$ | | |
| ... | ... | ... | ... | ... | ... | ... | ... | | |
| $B_{93,688}$ | $B_{93,695}$ | $B_{93,696}$ | $B_{93,703}$ | $B_{93,704}$ | $B_{93,711}$ | $B_{93,712}$ | $B_{93,719}$ | | |
| $B_{94,688}$ | $B_{94,695}$ | $B_{94,696}$ | $B_{94,703}$ | $B_{94,704}$ | $B_{94,711}$ | $B_{94,712}$ | $B_{94,719}$ | | |
| $B_{95,688}$ | $B_{95,695}$ | $B_{95,696}$ | $B_{95,703}$ | $B_{95,704}$ | $B_{95,711}$ | $B_{95,712}$ | $B_{95,719}$ | | |
| $B_{96,688}$ | $B_{96,695}$ | $B_{96,696}$ | $B_{96,703}$ | $B_{96,704}$ | $B_{96,711}$ | $B_{96,712}$ | $B_{96,719}$ | | |
| ... | ... | ... | ... | ... | ... | ... | ... | | |
| $B_{107,688}$ | $B_{107,695}$ | $B_{107,696}$ | $B_{107,703}$ | $B_{107,704}$ | $B_{107,711}$ | $B_{107,712}$ | $B_{107,719}$ | | |

FIG. 8A

| | | | | | | | | | | | |
|---|---|---|---|---|---|---|---|---|---|---|---|
| $B_{0,0}$ | $B_{0,172}$ | $B_{0,344}$ | $B_{0,516}$ | $B_{0,1}$ | ... | $B_{0,171}$ | $B_{0,343}$ | $B_{0,515}$ | $B_{0,687}$ | | |
| $B_{1,0}$ | $B_{1,172}$ | $B_{1,344}$ | $B_{1,516}$ | $B_{1,1}$ | ... | $B_{1,171}$ | $B_{1,343}$ | $B_{1,515}$ | $B_{1,687}$ | | |
| $B_{2,0}$ | $B_{2,172}$ | $B_{2,344}$ | $B_{2,516}$ | $B_{2,1}$ | ... | $B_{2,171}$ | $B_{2,343}$ | $B_{2,515}$ | $B_{2,687}$ | | |
| ... | ... | ... | ... | ... | ... | ... | ... | ... | ... | | |
| $B_{93,0}$ | $B_{93,172}$ | $B_{93,344}$ | $B_{93,516}$ | $B_{93,1}$ | ... | $B_{93,171}$ | $B_{93,343}$ | $B_{93,515}$ | $B_{93,687}$ | | |
| $B_{94,0}$ | $B_{94,172}$ | $B_{94,344}$ | $B_{94,516}$ | $B_{94,1}$ | ... | $B_{94,171}$ | $B_{94,343}$ | $B_{94,515}$ | $B_{94,687}$ | | |
| $B_{95,0}$ | $B_{95,172}$ | $B_{95,344}$ | $B_{95,516}$ | $B_{95,1}$ | ... | $B_{95,171}$ | $B_{95,343}$ | $B_{95,515}$ | $B_{95,687}$ | | |
| $B_{96,0}$ | $B_{96,172}$ | $B_{96,344}$ | $B_{96,516}$ | $B_{96,1}$ | ... | $B_{96,171}$ | $B_{96,343}$ | $B_{96,515}$ | $B_{96,687}$ | | |
| ... | ... | ... | ... | ... | ... | ... | ... | ... | ... | | |
| $B_{107,0}$ | $B_{107,172}$ | $B_{107,344}$ | $B_{107,516}$ | $B_{107,1}$ | ... | $B_{107,171}$ | $B_{107,343}$ | $B_{107,515}$ | $B_{107,687}$ | | |

96 ROWS | 12 ROWS

| | | | | | | | | | | |
|---|---|---|---|---|---|---|---|---|---|---|
| $B_{0,719}$ | $B_{1,719}$ | $B_{2,719}$ | ... | $B_{93,719}$ | $B_{94,719}$ | $B_{95,719}$ | $B_{96,719}$ | ... | $B_{107,719}$ |
| $B_{0,711}$ | $B_{1,711}$ | $B_{2,711}$ | ... | $B_{93,711}$ | $B_{94,711}$ | $B_{95,711}$ | $B_{96,711}$ | ... | $B_{107,711}$ |
| ... | ... | ... | ... | ... | ... | ... | ... | ... | ... |
| $B_{0,689}$ | $B_{1,689}$ | $B_{2,689}$ | ... | $B_{93,689}$ | $B_{94,689}$ | $B_{95,689}$ | $B_{96,689}$ | ... | $B_{107,689}$ |
| $B_{0,712}$ | $B_{1,712}$ | $B_{2,712}$ | ... | $B_{93,712}$ | $B_{94,712}$ | $B_{95,712}$ | $B_{96,712}$ | ... | $B_{107,712}$ |
| $B_{0,704}$ | $B_{1,704}$ | $B_{2,704}$ | ... | $B_{93,704}$ | $B_{94,704}$ | $B_{95,704}$ | $B_{96,704}$ | ... | $B_{107,704}$ |
| $B_{0,696}$ | $B_{1,696}$ | $B_{2,696}$ | ... | $B_{93,696}$ | $B_{94,696}$ | $B_{95,696}$ | $B_{96,696}$ | ... | $B_{107,696}$ |
| $B_{0,688}$ | $B_{1,688}$ | $B_{2,688}$ | ... | $B_{93,688}$ | $B_{94,688}$ | $B_{95,688}$ | $B_{96,688}$ | ... | $B_{107,688}$ |

| | | | | | | | | | | | | | | | |
|---|---|---|---|---|---|---|---|---|---|---|---|---|---|---|---|
| $B_{0,717}$ | $B_{1,717}$ | ... | $B_{5,717}$ | $B_{96,717}$ | $B_{6,717}$ | $B_{7,717}$ | ... | $B_{11,717}$ | $B_{97,715}$ | ... | $B_{90,717}$ | $B_{91,717}$ | ... | $B_{95,717}$ | $B_{107,719}$ |
| $B_{0,709}$ | $B_{1,709}$ | ... | $B_{5,709}$ | $B_{96,709}$ | $B_{6,709}$ | $B_{7,709}$ | ... | $B_{11,709}$ | $B_{97,707}$ | ... | $B_{90,709}$ | $B_{91,709}$ | ... | $B_{95,709}$ | $B_{107,711}$ |
| ... | ... | ... | ... | ... | ... | ... | ... | ... | ... | ... | ... | ... | ... | ... | ... |
| $B_{0,700}$ | $B_{1,700}$ | ... | $B_{5,700}$ | $B_{96,700}$ | $B_{6,700}$ | $B_{7,700}$ | ... | $B_{11,700}$ | $B_{97,698}$ | ... | $B_{90,700}$ | $B_{91,700}$ | ... | $B_{95,700}$ | $B_{107,702}$ |
| $B_{0,692}$ | $B_{1,692}$ | ... | $B_{5,692}$ | $B_{96,692}$ | $B_{6,692}$ | $B_{7,692}$ | ... | $B_{11,692}$ | $B_{97,690}$ | ... | $B_{90,692}$ | $B_{91,692}$ | ... | $B_{95,692}$ | $B_{107,694}$ |
| $B_{0,644}$ | $B_{1,644}$ | ... | $B_{5,644}$ | $B_{96,644}$ | $B_{6,644}$ | $B_{7,644}$ | ... | $B_{11,644}$ | $B_{97,601}$ | ... | $B_{90,644}$ | $B_{91,644}$ | ... | $B_{95,644}$ | $B_{107,687}$ |
| $B_{0,472}$ | $B_{1,472}$ | ... | $B_{5,472}$ | $B_{96,472}$ | $B_{6,472}$ | $B_{7,472}$ | ... | $B_{11,472}$ | $B_{97,429}$ | ... | $B_{90,472}$ | $B_{91,472}$ | ... | $B_{95,472}$ | $B_{107,515}$ |
| ... | ... | ... | ... | ... | ... | ... | ... | ... | ... | ... | ... | ... | ... | ... | ... |
| $B_{0,258}$ | $B_{1,258}$ | ... | $B_{5,258}$ | $B_{96,258}$ | $B_{6,258}$ | $B_{7,258}$ | ... | $B_{11,258}$ | $B_{97,215}$ | ... | $B_{90,258}$ | $B_{91,258}$ | ... | $B_{95,258}$ | $B_{107,301}$ |
| $B_{0,86}$ | $B_{1,86}$ | ... | $B_{5,86}$ | $B_{96,86}$ | $B_{6,86}$ | $B_{7,86}$ | ... | $B_{11,86}$ | $B_{97,43}$ | ... | $B_{90,86}$ | $B_{91,86}$ | ... | $B_{95,86}$ | $B_{107,129}$ |

ERROR CORRECTION METHOD FOR HIGH DENSITY DISC

CROSS-REFERENCE TO RELATED APPLICATIONS

This application is a continuation of application Ser. No. 10/890,255 filed on Jul. 14, 2004, now U.S. Pat. No. 7,370,267, which is a continuation of application Ser. No. 09/612,971 filed on Jul. 10, 2000, now U.S. Pat. No. 6,931,586, which claims the benefit of Korean Application No. 99-27453 filed on Jul. 8, 1999, in the Korean Intellectual Property Office, the disclosures of which are incorporated herein by reference.

BACKGROUND OF THE INVENTION

1. Field of the Invention

The present invention relates to an error correction method for optical discs, and more particularly, to an error correction method appropriate for high density discs.

2. Description of the Related Art

There are currently a variety of optical discs available, including a compact disc (CD), a digital versatile disc (DVD), and a high density DVD (HD-DVD), which requires higher density recording and reproducing than a DVD, and is currently under development. While a conventional DVD has a storage capacity of 4.7 GB, the HD-DVD has a storage capacity of 15 GB or more. The higher storage capacity of the HD-DVD is implemented by reducing the diameter of a beam spot for data recording/reproducing and increasing the line density.

The amount of data affected by a defect in an HD-DVD is far greater than the amount of data affected by the same length defect in a conventional DVD. Therefore, an HD-DVD requires stronger error correction than a conventional DVD.

Figure 1:
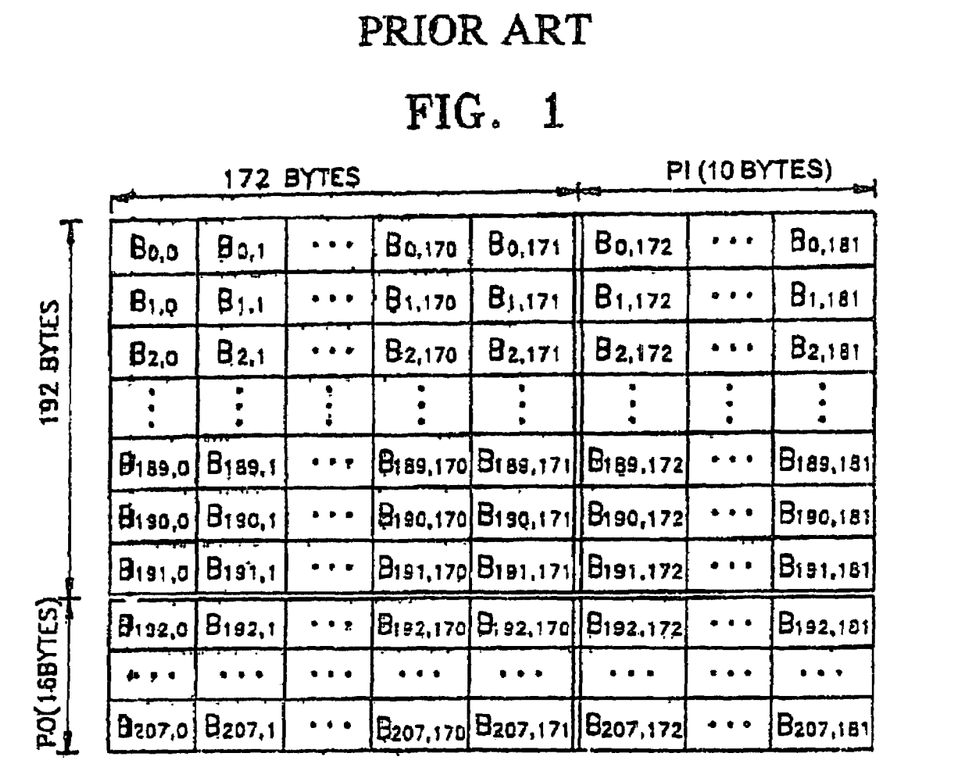
FIG. 1 is the structure of an error correction code (ECC) block in a conventional digital versatile disc (DVD)

FIG. 1 shows the structure of an error correction code (ECC) block in a conventional DVD. The error correction code block shown in FIG. 1 has a 10-byte parity for error correction of 172 bytes of data in the row direction, as an inner parity (PI), and a 16-byte parity for error correction of 192 bytes of data in the column direction, as an outer parity (PO). Here, the capability of error correction by the PI is a maximum of 5 bytes, and that of the PO is a maximum of 16 bytes for erasure correction.

Assuming that an HD-DVD uses the same error correction method as a conventional DVD, the effect of a defect will now be explained in detail.

Figure 2:
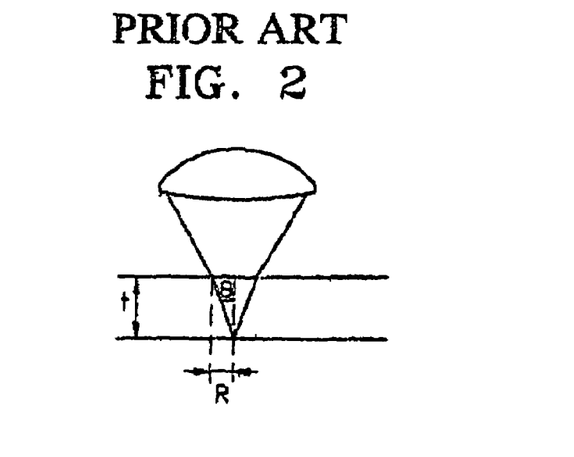
FIG. 2 illustrates the relationship between a beam spot and an object lens in an optical disc.

FIG. 2 illustrates the relationship of a beam spot and an object lens in an optical disc.

Table 1 illustrates the relationships among t, the thickness of a disc, NA, the numerical aperture of an object lens, 2R, the diameter of a beam spot, and k, the length of a defect.

TABLE 1

| t (mm) | NA | R (mm) | 2R (mm) | Remark | k, length of defect |
|---|---|---|---|---|---|
| 0.6 | 0.6 | 0.248 | 0.496 | DVD | k + 2R |
|  | 0.65 | 0.273 | 0.546 |  |  |
| 0.3 | 0.65 | 0.136 | 0.272 |  |  |
|  | 0.85 | 0.193 | 0.286 |  |  |
| 0.2 | 0.85 | 0.129 | 0.258 |  |  |
| 0.1 | 0.7 | 0.049 | 0.098 | DVD/3.88 |  |
|  | 0.85 | 0.064 | 0.128 |  |  |

1) The Effect of a Large Defect

Here, a large defect means a burst error which cannot be corrected by a PI, and is generated by a scratch, a finger print, a black dot, etc.

A defect which spans 5 bytes or more is a burst error which cannot be corrected by a PI. At this time, the length of a defect is k=5 bytes×16 channel bits×0.133 Fm (the length of 1 channel bit)=10.64 Fm.

When a 20 GB HD-DVD is compared to a 4.7 GB DVD, the line density increase is (20/4.7)1/2. Accordingly, the same length defect damages 2.1 times more data in an HD-DVD than in a DVD.

Though an HD-DVD seems to be more advantageous than a DVD due to the HD-DVD's smaller spot size, the stabilization time required for restoring a reproduction signal (RF) in an HD-DVD is longer. Therefore, the effect of a spot size is thought to be similar in an HD-DVD and a DVD.

2) The Effect of a Small Defect

Here, a small defect means a burst error which can be corrected by a PI, and is generated by dust and the like. The length of the defect is equal to or less than 10.64 Fm.

According to table 1, when NA=0.85 and t=0.1 mm, the diameter of a beam spot incident upon the surface of an HD-DVD is 0.128 Fm, which is 1/3.88 times that of a DVD with a diameter of the beam spot being 0.496 Fm. Therefore, the HD-DVD's probability of error occurrence by a small defect becomes 3.88 times greater than that of a DVD.

In addition, since the line density of an HD-DVD is 2.1 times greater than that of a conventional DVD, the probability of error in an HD-DVD is 8.148 times (3.88×2.1=8.148) greater than that of a DVD for the same size defect. This means that when an HD-DVD uses the same modulation method as a DVD, error correction by a PI must be available for about 40.74 bytes (5 bytes×8.148). Therefore, an HD-DVD requires a great number of PIs.

In the previous DVD error correction method shown in FIG. 1, in order to raise the burst error correction capability, the number of data columns must be increased in the PI direction, while the number of data rows must be decreased in the PO direction.

However, when n, the number of data columns in the PI direction, exceeds 256, a Galois Field operation GF(28) cannot be performed.

Thus, the previous error correction method in a DVD as shown in FIG. 1 cannot be easily applied to HD-DVD.

SUMMARY OF THE INVENTION

Accordingly, it is an object of the present invention to provide an error correction method appropriate for an HD-DVD.

It is another object to provide a basic addressing structure appropriate for the HD-DVD.

Additional objects and advantages of the invention will be set forth in part in the description which follows, and, in part, will be obvious from the description, or may be learned by practice of the invention.

To accomplish the above objects of the present invention, there is provided an error correction method adding inner parity and outer parity to an error correction block having a size of n bytes x m x o, the error correction method having the steps of obtaining a plurality of inner parity blocks (PI blocks) by segmenting the error correction block in an inner parity (PI) direction into x segments (here, x is an integer equal to or greater than 2); generating e-byte PI for each of the plurality of PI blocks generated by segmenting, and adding the PIs in the PI direction; and generating f-byte outer parity (PO) in the PO direction of the error correction block having PIs, and adding the POs in a PO direction.

It is preferable that the data frame, which forms an error correction block, is formed with two 2-KB user data blocks.

Also, it is preferable that the data frame has EDCs for correcting errors in user data.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Reference will now be made in detail to the present preferred embodiment of the present invention, examples of which are illustrated in the accompanying drawings, wherein like reference numerals refer to like elements throughout.

Figure 3:
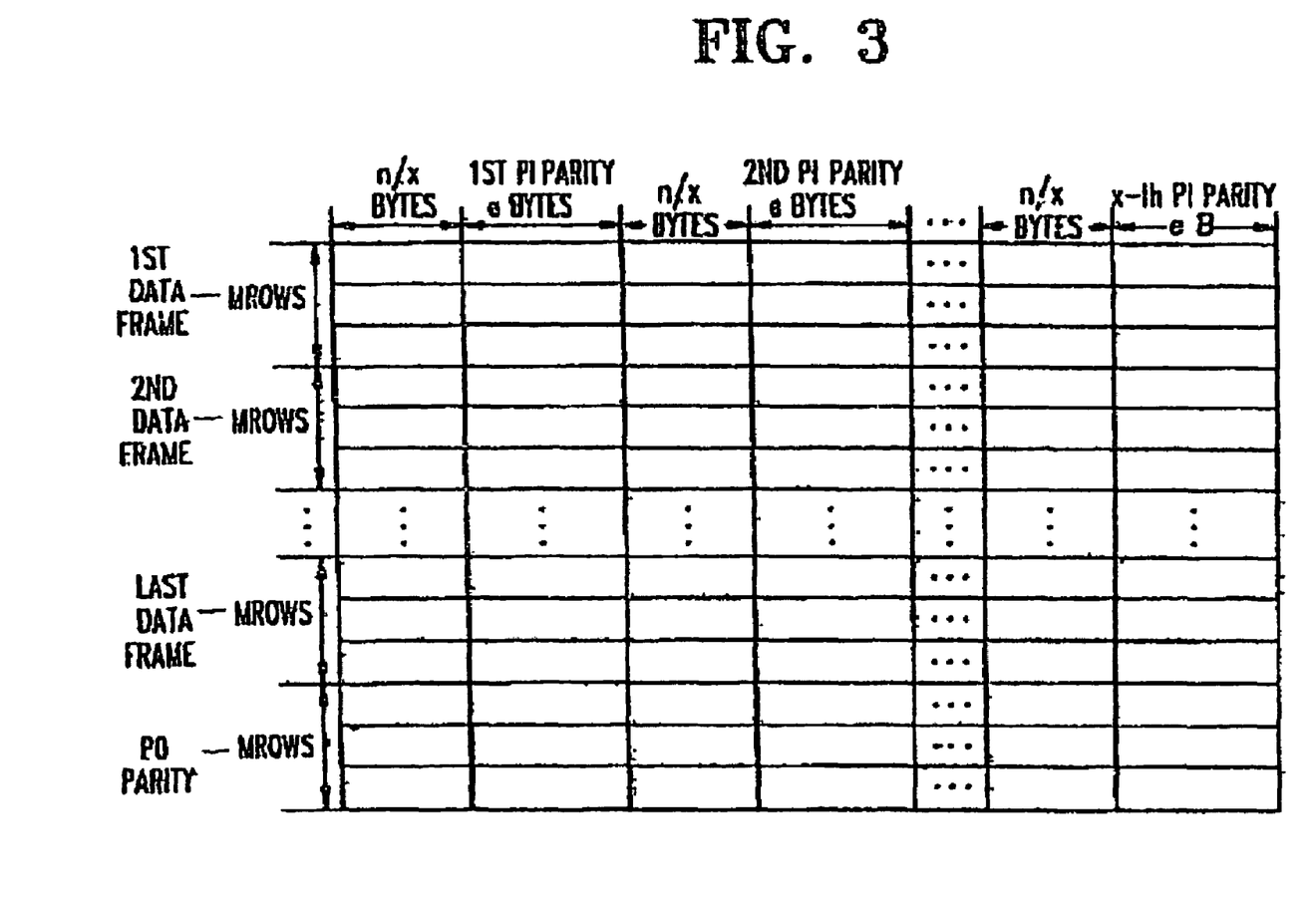
FIG. 3 illustrates the relationships between an ECC block, an inner parity and an outer parity in the error correction method according to an embodiment of the present invention.

FIG. 3 illustrates the relationships between an error correction block, an inner parity (PI) and an outer parity (PO) in an error correction method according to an embodiment of the present invention. As a method for improving a burst error correction capability in using the same number of parities, it is preferable that the number of data columns is increased in the PI direction and the number of data rows is decreased in the PO direction.

However, since a Galois Field operation cannot be performed when n, the number of data columns in the PI direction exceeds 256, the present invention uses a multi-way PI error correction method.

That is, n, the number of data columns in a row is divided into segments with an appropriate size (x), and then, an e-byte PI is added to each segmented PI block. Here, the size n/x is determined to be an appropriate size for adding a synchronous signal, and n, x, and e are determined so that n/x+e is less than or equal to 256.

If the number of data frames in the PO direction is 16, m (rows)×16+f (rows) is less than or equal to 256. Furthermore, x (the number of PI direction segments), and f, (the number of PO direction parities), are decided so that the result of multiplication of x with f is divided by o, the number of data frames, without a remainder. In this case, f can be not equal to o, the number of data frames, unlike a conventional DVD, in which f is equal to o.

The error correction block shown in FIG. 3 causes a problem when the block is recorded on a disc immediately after channel-modulation. That is, when a small defect occurs and e/2 bytes of data or more are damaged, correction by a PI becomes impossible. Therefore, after adding a flag indicating that all data in the corresponding PI block is not corrected, the data must be sent to an error correction process by a PO. When greater than or equal to f data is sent to a PO with a flag indicating that the data is not corrected by a PI, the PO cannot correct the error either.

In order to effectively correct small defects and sporadically occurring errors, interleaving is performed in the PI direction in x PI blocks.

Figure 4:
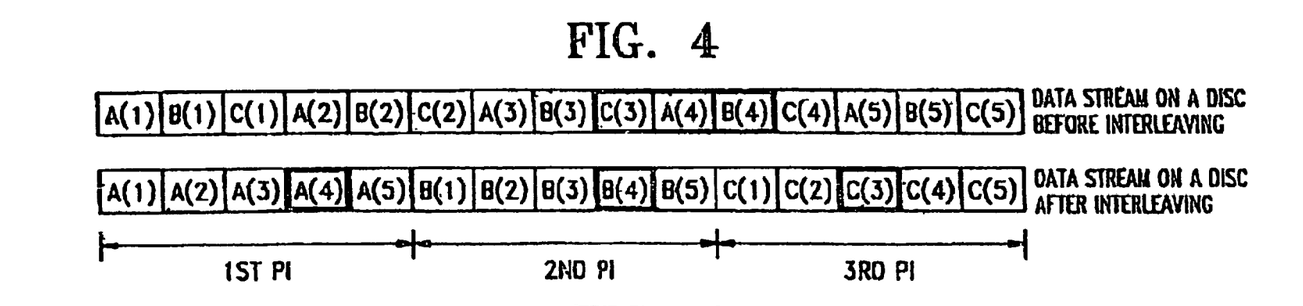
FIG. 4 illustrates the effect by an interleave between inner parity (PI) blocks in the same row.

FIG. 4 illustrates the effect of interleaving PI blocks in the same row. As shown in FIG. 4, even though a burst error occurs, the burst error changes into sporadic errors due to the interleaving between the PI blocks. Therefore, even when e/2 or more bytes of data are damaged, the number of errors are reduced to equal to or less than e/2 in a PI block after interleaving, and error correction becomes possible.

There is another method in which e-byte parity is added to each x-th data in the same PI direction. In one method, interleaving is performed among PI blocks in different rows in order to increase the interleaving effect. In this method, however, there is greater delay between the time when error correction is completed and the time when data is output. Therefore, it is preferable that the scope of interleaving is determined as a function of the delay and the size of burst defects to be corrected.

Figure 5:
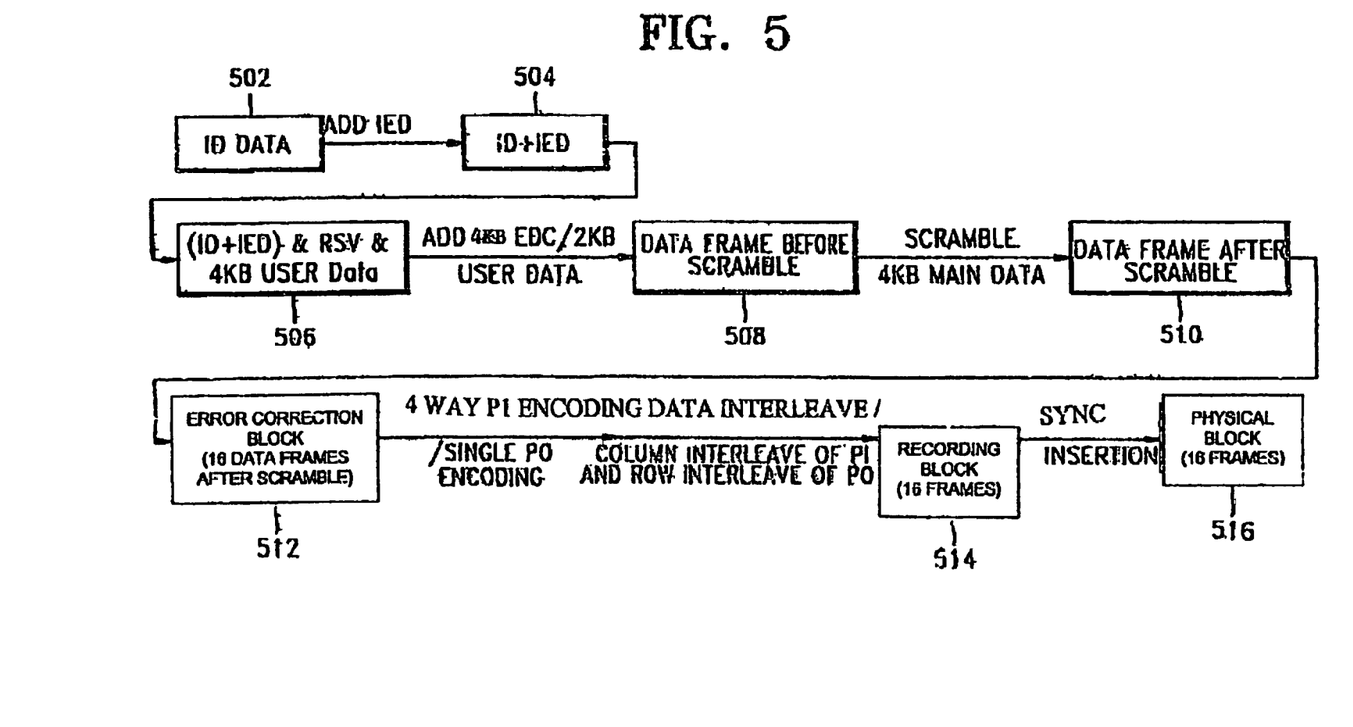
FIG. 5 shows the process for performing an error correction method according to the embodiment of the present invention.

FIG. 5 shows the process for performing an error correction method according to the embodiment of the present invention.

First, data for detection (IED) is added to address information (ID) 502 to yield "ID+IED" 504.

Next, reserve space (RSV) for storing future scalability, user information, producer information, copyright protection, etc., and 4 KB user data is added To "ID+IED" 504 to yield "(ID+IED) & RSV & 4 KB USER DATA" 506.

Next, 4 KB of user data is divided into 2 KB, considering compatibility to an existing compact disc (CD) and a digital versatile disc (DVD), and then, an error detection code (EDC) for detecting an error is added. By doing so, one data frame 508 is formed.

Next, in order to obtain data protection, channel modulation, and servo capacity, scrambling is performed on data frame 508. For example, in order to properly perform scrambling of data on a 20 GB-level HD-DVD having 4 KB data frames and a 64 KB basic unit for error correction, the length of the cycle of the random data generator in an HD-DVD having a 64 KB basic unit for error correction and a 4 KB user data in one data frame is designed to be 64 K, which is advantageous in suppressing direct current (DC) component during servo operation and modulation.

Figure 6:
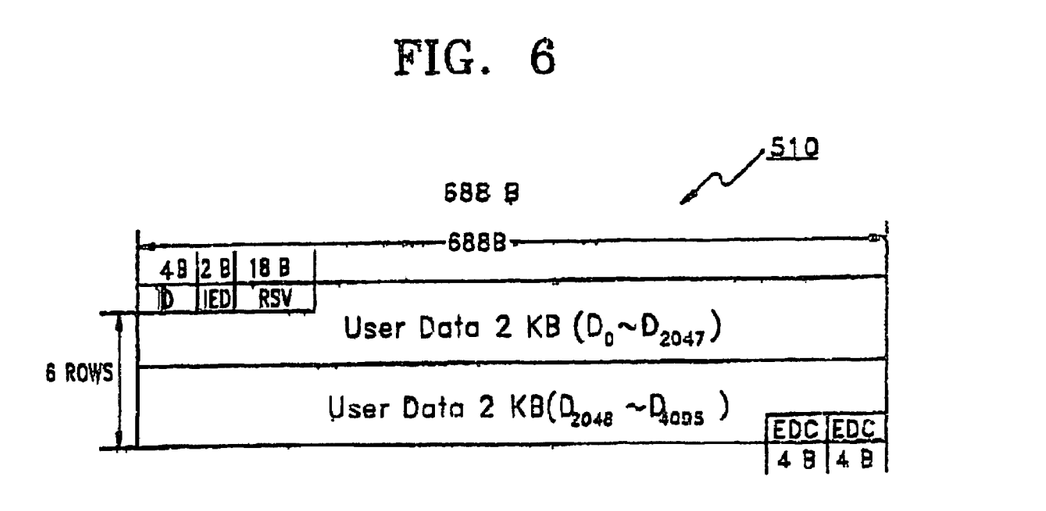
FIG. 6 illustrates the structure of a data frame after it has been scrambled in the error correction method of FIG. 5.

FIG. 6 illustrates the structure of the data frame 510 after it has been scrambled in the error correction method in FIG. 5. Referring to the example in FIG. 6, data frame 510 is formed with a 4-byte ID, a 2-byte IED, an 18-byte RSV, two 2-KByte user data blocks, and two 4-byte EDCs. Here, one data frame 510 is 688 bytes in the PI direction (column direction), and 6 rows in the PO direction (row direction).

Returning now to FIG. 5, one error correction block 512 is formed by gathering 16 data frames 510 shown, and a PI and a PO are added to the block. This error correction block 512 then undergoes the steps of PI/PO encoding and PI/PO interleaving to form recording block 514. Finally, a synchronous signal is added to recording block 514 yielding physical block 516, which is then recorded on a disc.

We now turn to FIGS. 7-10, which illustrate in detail the PI/PO encoding and interleaving of the present invention.

Figure 7A:
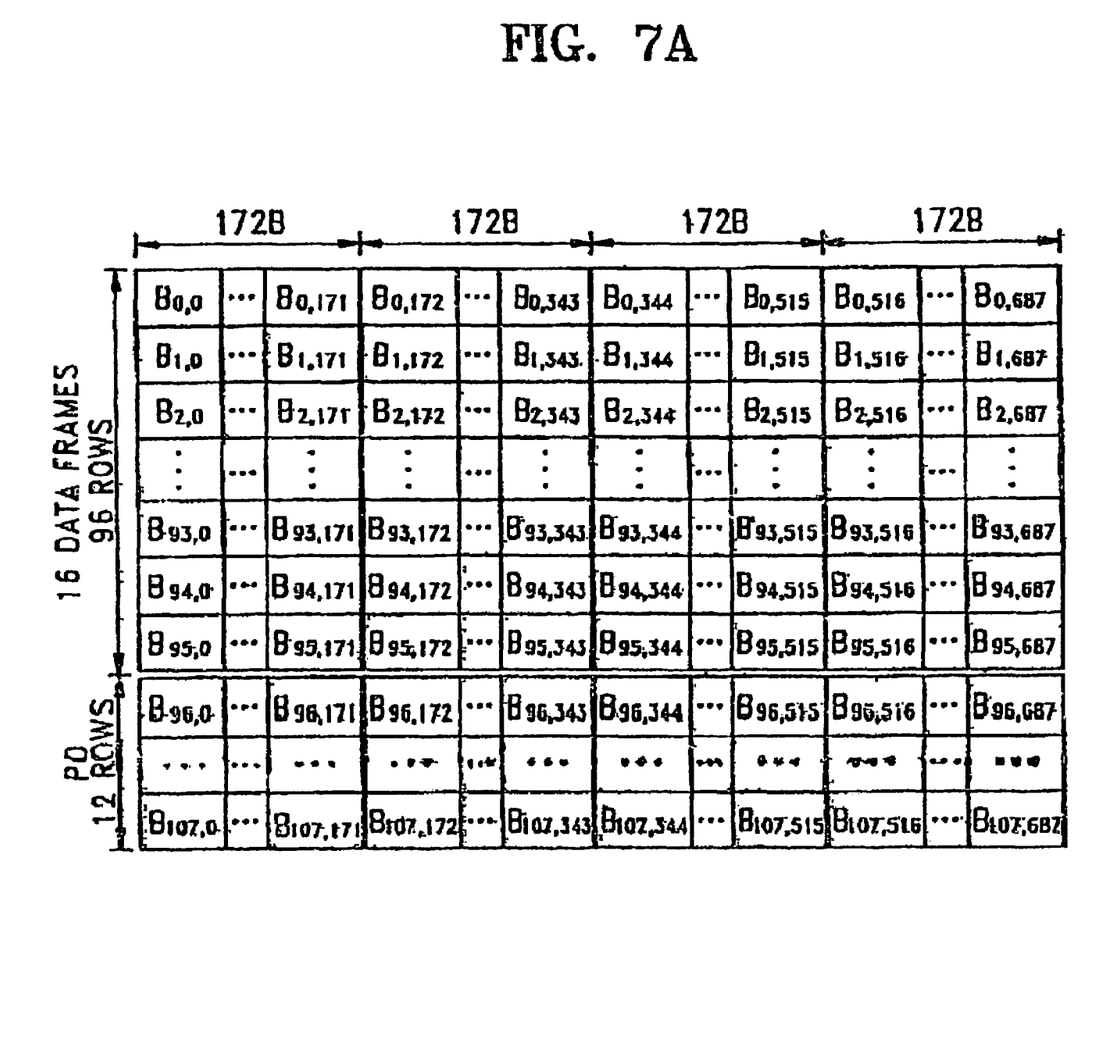
FIGS. 7A and 7B illustrate generation of inner parity and outer parity in an error correction block in the error correction method of FIG. 5.
Figure 7B:
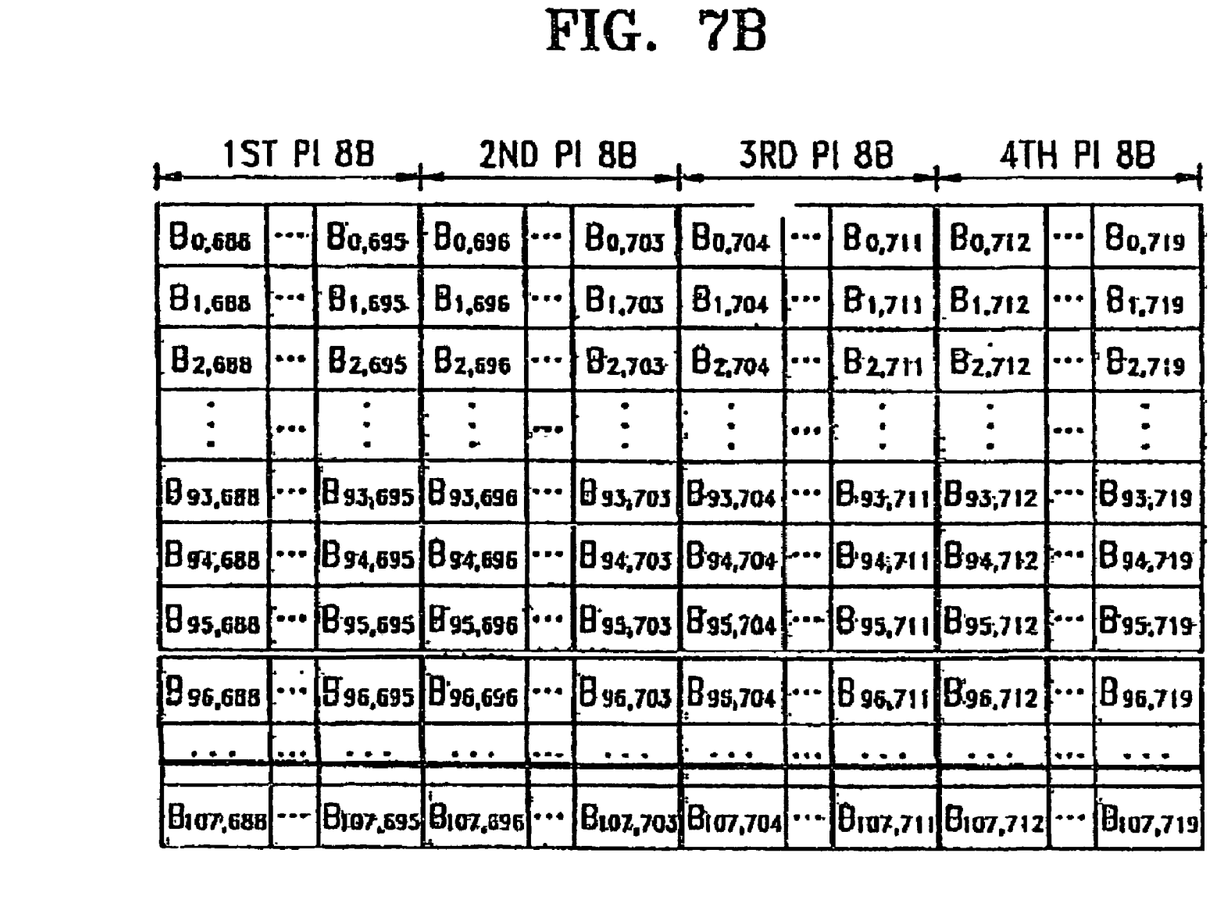

FIGS. 7A and 7B illustrate the generation of inner parity and outer parity in an error correction block shown as "4 way PI ENCODING\SINGLE PO ENCODING" in FIG. 5. Referring to FIGS. 7A and 7B, 16 data frames 510 are lined up and then, four PIs, each of which have 8 bytes in the PI direction, are added, and a PO, which has 12 byte to the PO direction, is added.

1) PO

PO is generated by using the Reed Solomon code RS(108, 96, 13).

That is, for data (B0,0~Bi,j, i=0~95, j=0~687), B96,0~Bi,j are generated.

2) PI

PI is generated by using RS(180, 172, 9).

That is, for data (Bi,0~Bi,171, i=0~107), Bi,688~Bi,695 (i=0~107) are generated; for data (Bi,172~Bi,343, i=0~107), Bi,696~Bi,703 (i=0~107) are generated; for data (Bi,344~Bi, 545, i=0~107), Bi,704~Bi,711 (i=0~107) are generated; and for data (Bi,546~Bi,687, i=0~107), Bi,712~Bi,719 (i=0~107) are generated.

Parties are generated in 4 ways in the PI direction so that no PI correction unit (including parity) exceeds 256, thus a GF (28) operation in a Galois Field can be performed. This also permits the addition of correction incapability flags in four divided units for better erase correction in the PO correction process.

Furthermore, interleaving four PI blocks improves PI correction capability. In the present invention, such an error correction method is referred to as Reed-Solomon multiple way PI or PO product code (RS-MWPC).

Figure 8A:
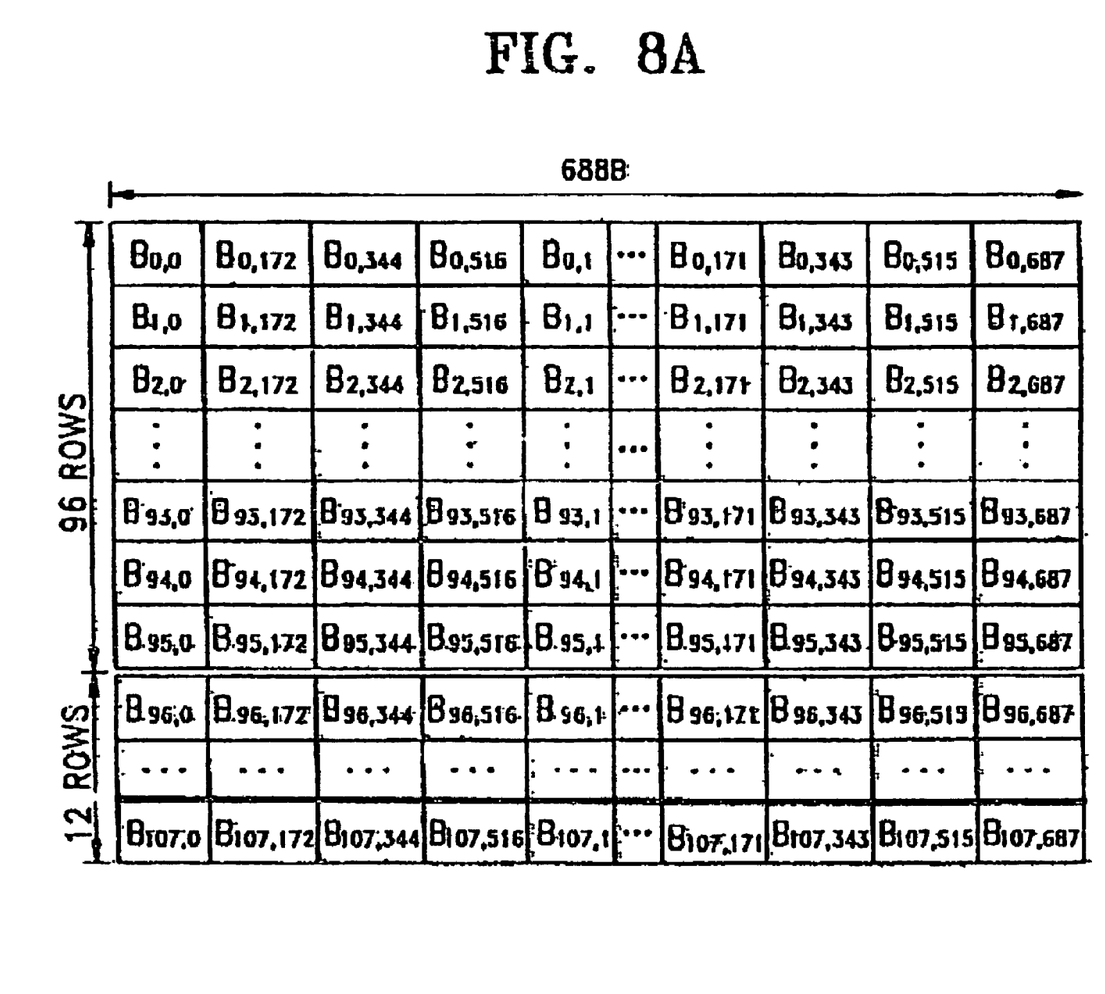
FIGS. 8A and 8B illustrate the result of interleaving to the inner parity direction in the error correction method of FIG. 5.
Figure 8B:
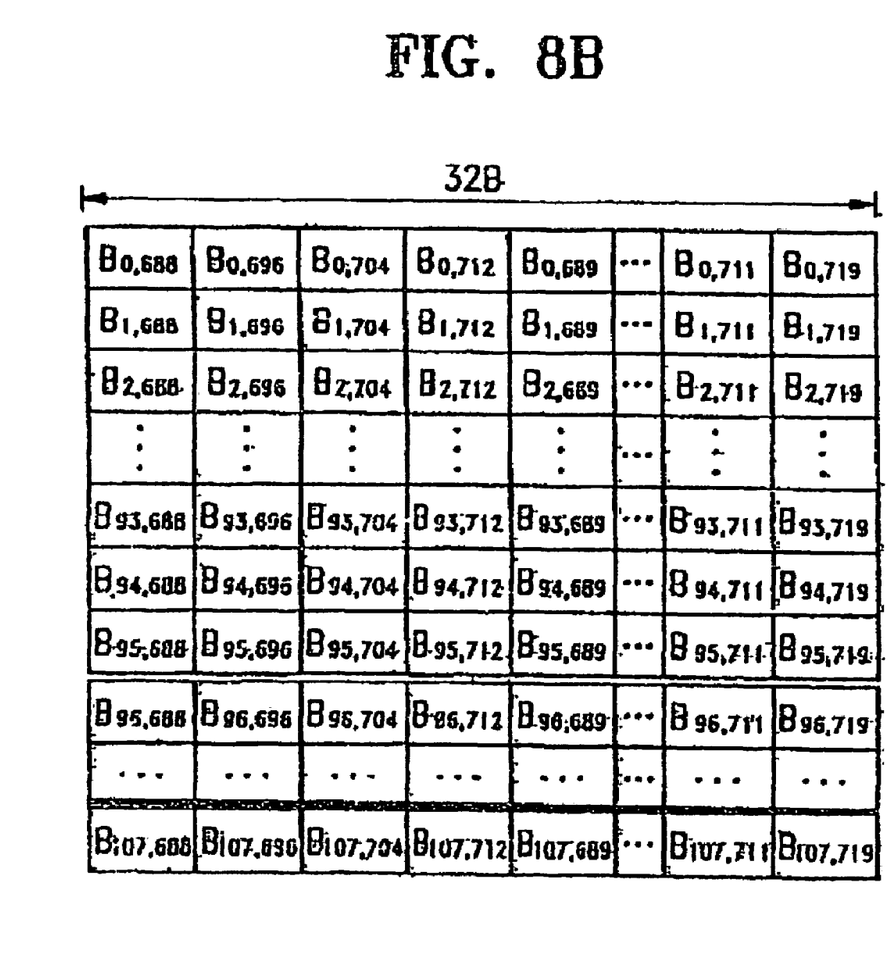

After PI/PO encoding, a burst error in the PI direction is changed into sporadic errors, and in order to protect PI and PO, interleaving is performed in the PI direction. FIGS. 8A and 8B illustrate the result of this interleaving process, which is shown in FIG. 5 as "DATA INTERLEAVE COLUMN INTERLEAVE OF PI". Referring to FIGS. 8A and 8B, data in four PI blocks is reallocated one by one in a predetermined turn in the data section and the parity section.

Figure 9:
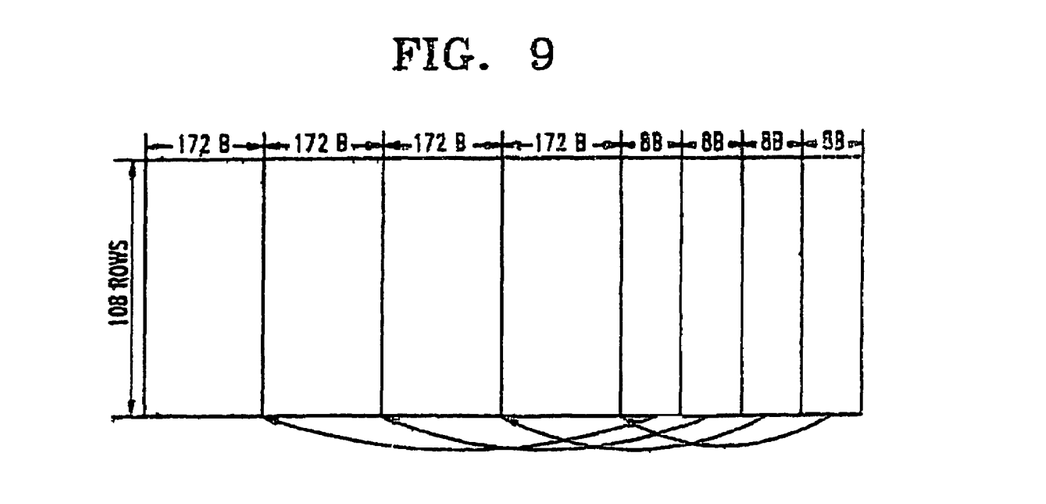
FIG. 9 illustrates the result of interleaving the result shown in FIG. 8 again in the inner parity direction.

FIG. 9 illustrates the result of interleaving the result shown in FIGS. 8A and 8B again in the PI direction. PI divides each 8 bytes in the PI direction and performs interleaving. This is to prevent occurrence of burst errors in PIs.

When interleaving in PIs is completed, 12 rows including PO+PI parities from the 97th row to the 108th row are reorganized into 16 rows. The reason why 12 rows including PO+PI parities can be reorganized into 16 rows is that the result of multiplication of 4(x), which is the number of PI direction segments, by 12 (f), which is the number of PO+PI parity rows, is 16 (o), the number of data frames. To achieve this, 720 bytes (688+32) in the first PO+PI parity row is multiplied by ¾, and then, 540 bytes become the first new PO+PI parity row, and the remaining 720−540=180 bytes are passed to the second PO+PI parity row. The 180 bytes are added to 720 bytes that are in the second PO+PI parity row, and then the first 540 bytes in the result of the addition are changed into the second PO+PI parity row.

Figure 10A:
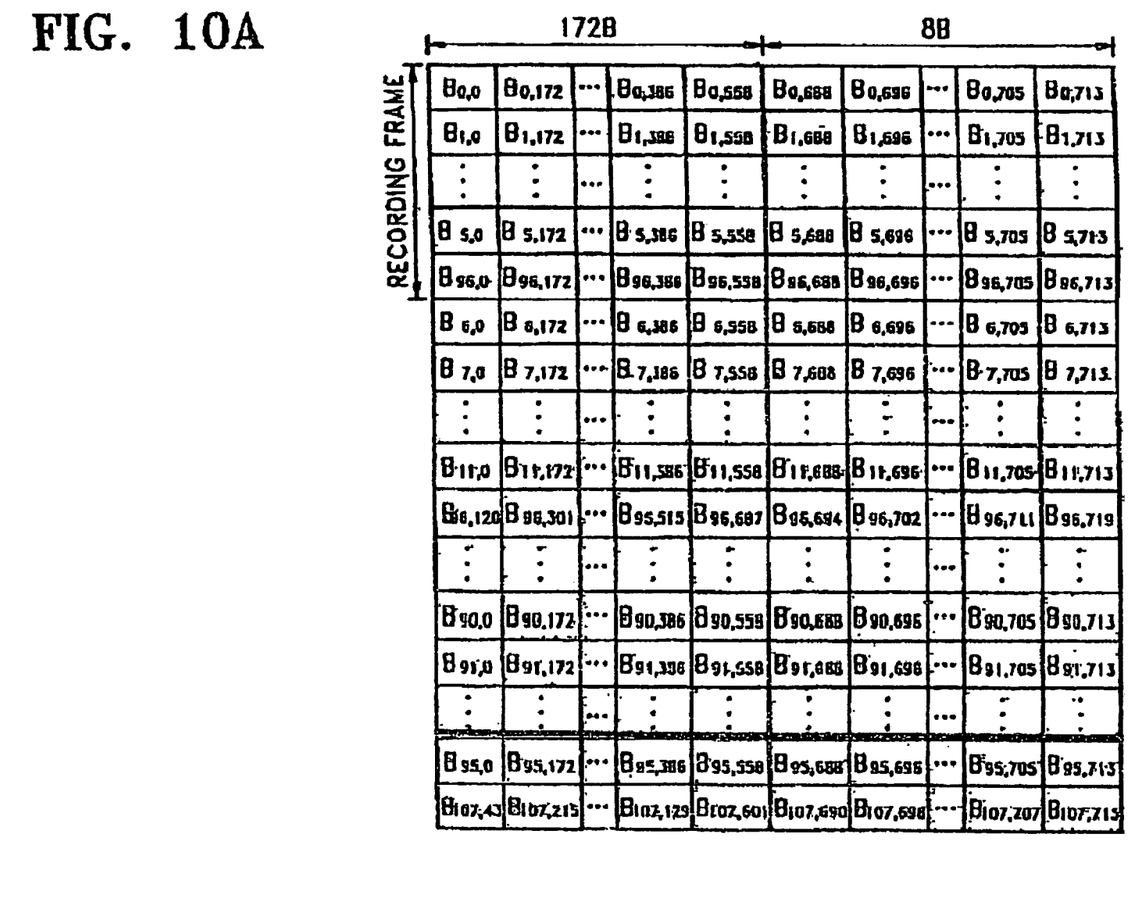
FIGS. 10A through 10D illustrate the result of interleaving in the outer parity direction in the error correction method in FIG. 5.
Figure 10B:
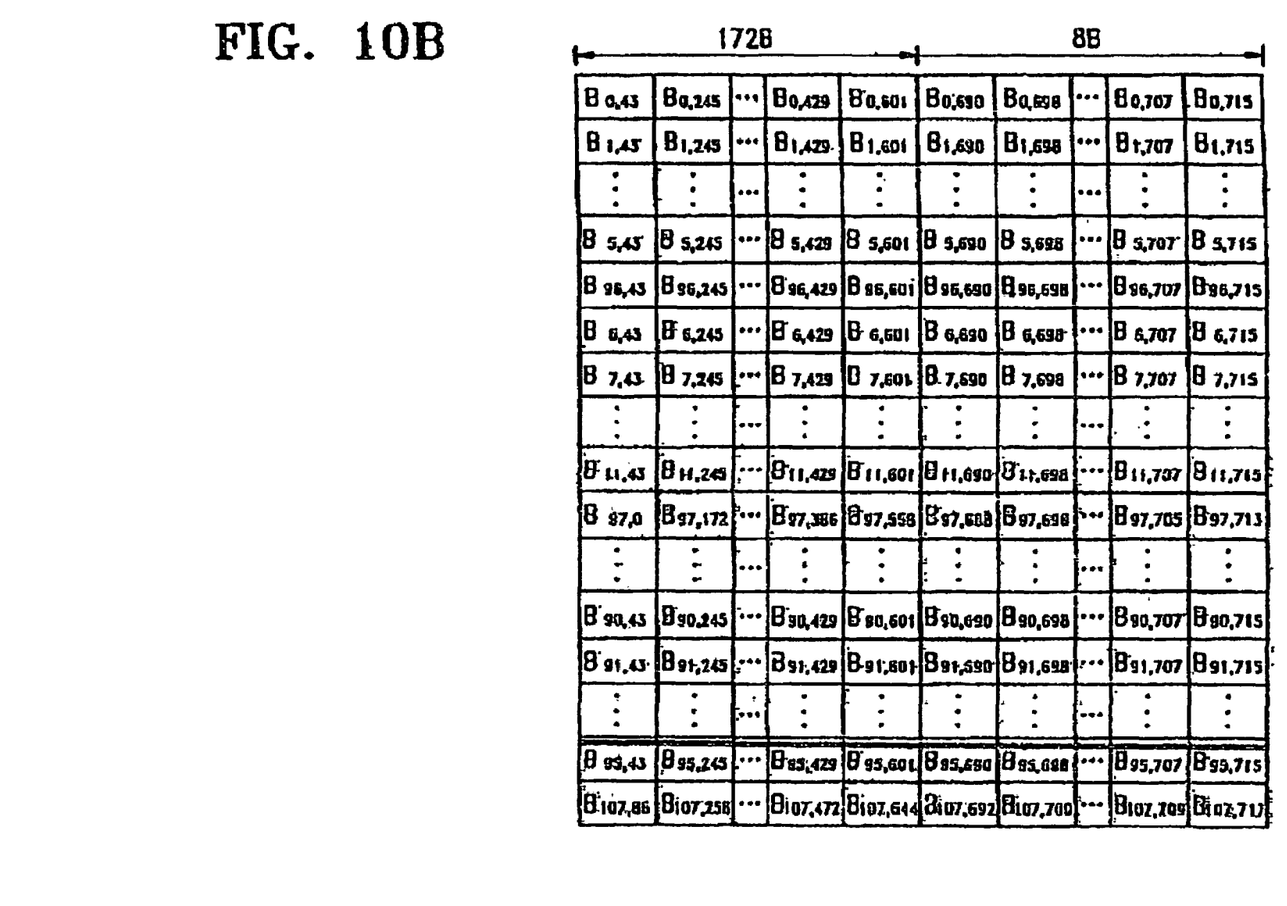
Figure 10C:
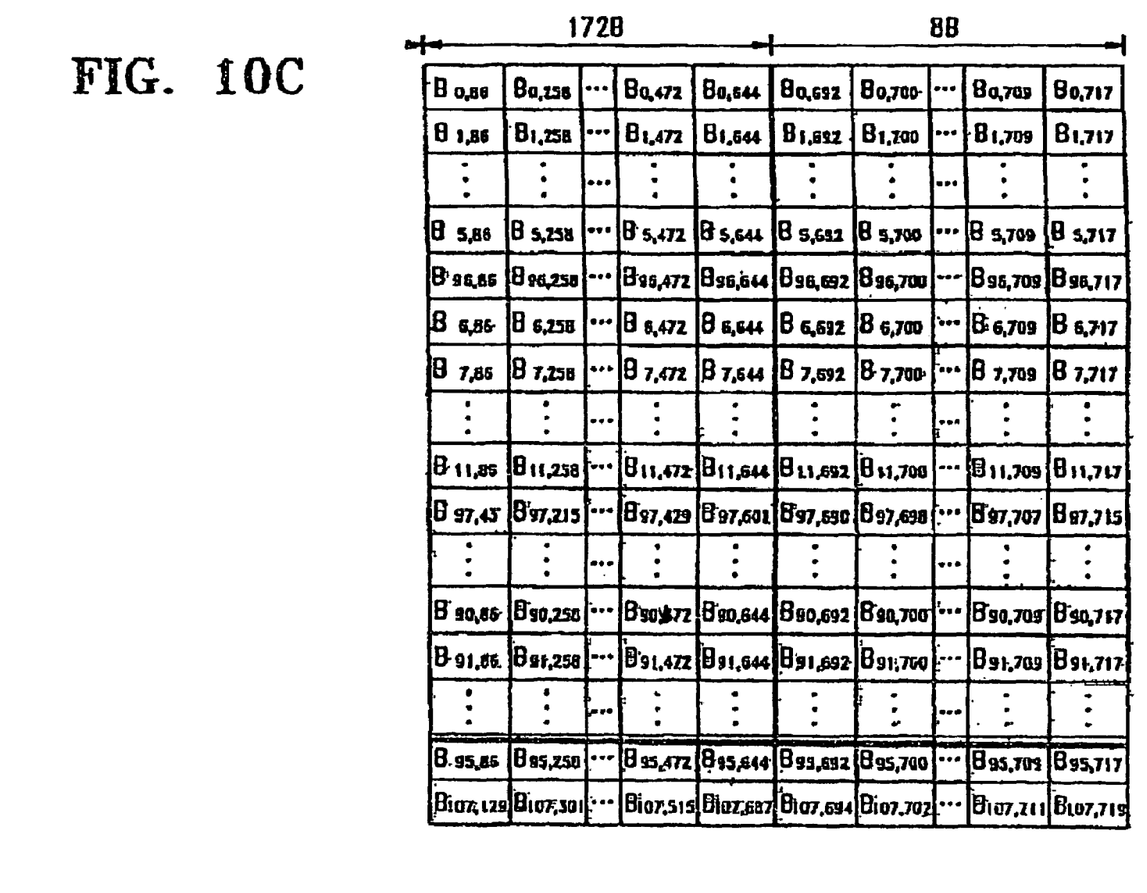
Figure 10D:
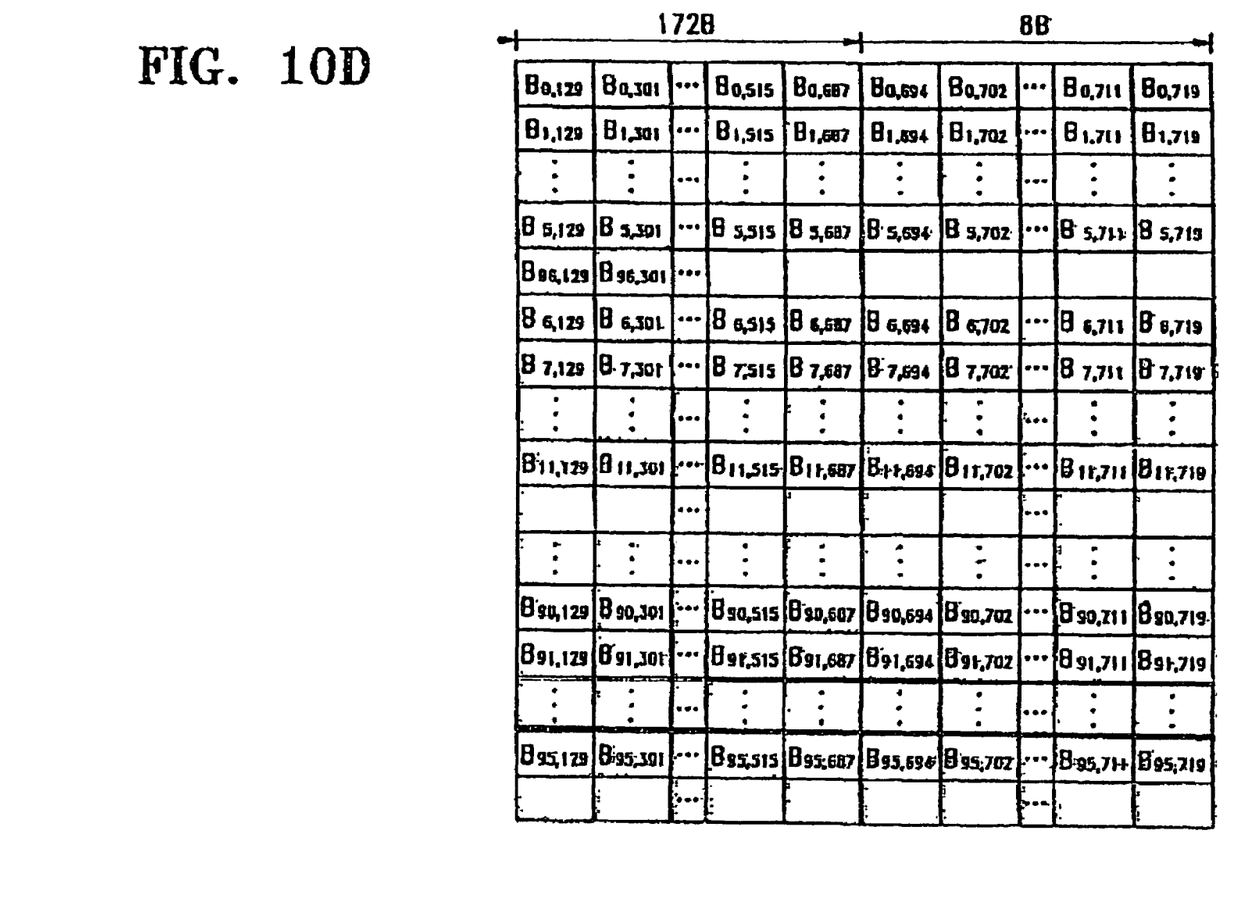

By doing so, the 12 rows are changed into a total of 16 rows of new PO+PI parity rows. By interleaving to the PO direction from the first row, all interleaving is finished and a total of 16 recording frames are reorganized as shown in FIGS. 10A and 10B. After inserting a synchronous signal and performing channel modulation, this data is in a form that can be actually recorded on optical disc.

As described above, the error correction method according to the present invention enhances error correction capability in an HD-DVD while maintaining redundancy of parity code on a level similar to conventional DVDs.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A recording apparatus to record data on a disk, the disk including an error correction block structure to correct an error on the disk, the recording apparatus comprising:
   an optical pickup to record data on the disk; and
   a controller which controls the optical pickup to record the error correction block structure on the disk, the error correction block structure comprising:
      a plurality of correction blocks, each correction block segmented into a predetermined size in an inner parity (PI) direction;
      a plurality of f-byte outer parities, each f-byte outer parity located adjacent to a corresponding segmented correction block in an outer parity (PO) direction; and
      a plurality of e-byte inner parities, each e-byte inner parity located adjacent to a corresponding segmented correction block and to a corresponding f-byte outer parity, in the inner parity (PI) direction.

2. The recording apparatus of claim 1, wherein the error correction block structure further comprises a plurality of data structures interleaved with the inner parity blocks.

3. The recording apparatus of claim 2, wherein the error correction block structure further comprises a plurality of f-byte outer parities interleaved in the outer parity direction.

4. The recording apparatus of claim 1, wherein the high density digital versatile disk has a storage capacity of at least 15 GB.

\* \* \* \* \*